(12) United States Patent
Karda et al.

(10) Patent No.: US 11,107,817 B2
(45) Date of Patent: Aug. 31, 2021

(54) INTEGRATED ASSEMBLIES COMPRISING HYDROGEN DIFFUSED WITHIN TWO OR MORE DIFFERENT SEMICONDUCTOR MATERIALS, AND METHODS OF FORMING INTEGRATED ASSEMBLIES

(71) Applicant: Micron Technology, inc., Boise, ID (US)

(72) Inventors: Kamal M. Karda, Boise, ID (US); Yi Fang Lee, Boise, ID (US); Haitao Liu, Boise, ID (US); Durai Vishak Nirmal Ramaswamy, Boise, ID (US); Ramanathan Gandhi, Boise, ID (US); Karthik Sarpatwari, Boise, ID (US); Scott E. Sills, Boise, ID (US); Sameer Chhajed, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/298,947

(22) Filed: Mar. 11, 2019

(65) Prior Publication Data

US 2020/0295005 A1     Sep. 17, 2020

(51) Int. Cl.
*H01L 27/105*     (2006.01)
*H01L 27/092*     (2006.01)
(Continued)

(52) U.S. Cl.
CPC ........ *H01L 27/1052* (2013.01); *H01L 27/092* (2013.01); *H01L 27/124* (2013.01);
(Continued)

(58) Field of Classification Search
CPC ........... H01L 27/1159; H01L 29/78391; H01L 29/165; H01L 29/0847; H01L 29/7827;
(Continued)

(56) References Cited

U.S. PATENT DOCUMENTS 5,581,100 A * 12/1996 Ajit ..................... H01L 29/0696
257/331
5,763,904 A * 6/1998 Nakajima ......... H01L 21/28512
257/66

(Continued)

FOREIGN PATENT DOCUMENTS

JP     2013-219336     10/2013
KR     10-2009-0007921     1/2009
(Continued)

*Primary Examiner* — Mouloucoulaye Inoussa
(74) *Attorney, Agent, or Firm* — Wells St. John P.S.

(57) ABSTRACT

Some embodiments include an integrated assembly having a first semiconductor material between two regions of a second semiconductor material. The second semiconductor material is a different composition than the first semiconductor material. Hydrogen is diffused within the first and second semiconductor materials. The conductivity of the second semiconductor material increases in response to the hydrogen diffused therein to thereby create a structure having the second semiconductor material as source/drain regions, and having the first semiconductor material as a channel region between the source/drain regions. A transistor gate is adjacent the channel region and is configured to induce an electric field within the channel region. Some embodiments include methods of forming integrated assemblies.

35 Claims, 13 Drawing Sheets

(51) Int. Cl.
*H01L 27/12* (2006.01)
*H01L 29/66* (2006.01)
*H01L 29/267* (2006.01)
*H01L 29/423* (2006.01)
*H01L 29/786* (2006.01)
*H01L 29/24* (2006.01)

(52) U.S. Cl.
CPC ...... *H01L 27/1207* (2013.01); *H01L 27/1225* (2013.01); *H01L 27/1255* (2013.01); *H01L 27/1259* (2013.01); *H01L 29/24* (2013.01); *H01L 29/267* (2013.01); *H01L 29/42392* (2013.01); *H01L 29/66969* (2013.01); *H01L 29/7869* (2013.01); *H01L 29/78642* (2013.01)

(58) Field of Classification Search
CPC ........... H01L 27/11592; H01L 29/1095; H01L 43/12; H01L 27/222; H01L 43/02; H01L 21/3081; H01L 21/02164; H01L 21/28525; H01L 21/28518; H01L 21/324; H01L 27/115; H01L 27/11582; H01L 27/11578; H01L 27/1151; H01L 27/11556; H01L 27/10808; H01L 27/10876; H01L 27/10885; G11C 11/2273; G11C 11/223; G11C 11/2257
USPC ............. 257/324, 2, 329, E21.662, E27.103; 438/129, 197, 102, 268, 586
See application file for complete search history.

(56) References Cited

U.S. PATENT DOCUMENTS

| | | | |
|---|---|---|---|
| 6,808,971 B2 | 10/2004 | Bhattacharyya | |
| 2009/0020753 A1 | 1/2009 | Jeong et al. | |
| 2009/0026458 A1* | 1/2009 | Ebbers | H01L 21/02581 257/64 |
| 2009/0180324 A1* | 7/2009 | Ramaswamy | H01L 21/8239 365/185.17 |
| 2010/0140685 A1* | 6/2010 | Kang | H01L 27/115 257/324 |
| 2010/0200916 A1* | 8/2010 | Gossner | H01L 29/165 257/335 |
| 2012/0045879 A1* | 2/2012 | Verhulst | H01L 29/0665 438/285 |
| 2013/0244374 A1 | 9/2013 | Okazaki et al. | |
| 2014/0061745 A1* | 3/2014 | Myung | H01L 21/743 257/302 |
| 2017/0222057 A1 | 8/2017 | Yamazaki et al. | |
| 2019/0296018 A1* | 9/2019 | Cho | H01L 27/10855 |
| 2019/0393222 A1* | 12/2019 | Sharma | H01L 27/10817 |

FOREIGN PATENT DOCUMENTS

WO    WO 2018-182738    10/2018
WO    WO PCT/US2020/017653    6/2020

* cited by examiner

FIG. 2

INTEGRATED ASSEMBLIES COMPRISING HYDROGEN DIFFUSED WITHIN TWO OR MORE DIFFERENT SEMICONDUCTOR MATERIALS, AND METHODS OF FORMING INTEGRATED ASSEMBLIES

TECHNICAL FIELD

Integrated assemblies comprising hydrogen diffused within two or more different semiconductor materials, and methods of forming integrated assemblies.

BACKGROUND

Semiconductor materials may be incorporated into integrated assemblies. For instance, the semiconductor materials may be utilized to form channel regions and source/drain regions of transistors. The transistors may be utilized as access devices in memory arrays, or in other applications.

It would be desirable to develop improved arrangements of semiconductor materials suitable for utilization in integrated assemblies, and to develop integrated components utilizing the improved arrangements of semiconductor materials.

BRIEF DESCRIPTION OF THE DRAWINGS

FIGS. 1-4 are diagrammatic cross-sectional side views of a region of an example integrated assembly at example process stages of an example method for fabricating an example memory cell.

DETAILED DESCRIPTION OF THE ILLUSTRATED EMBODIMENTS

Some embodiments include assemblies having a different composition of semiconductor material in a channel-region-location of transistor device than in source/drain-region-locations of the transistor device. The conductivity of the source/drain-region-locations increases substantially (e.g., increases by at least a factor of 10) due to hydrogen being diffused therein, while the conductivity of the channel-region-location is increased little, if at all, due to the hydrogen being diffused therein. Some embodiments include methods of forming integrated assemblies. Example embodiments are discussed with reference to FIGS. 1-12.

Figure 1:
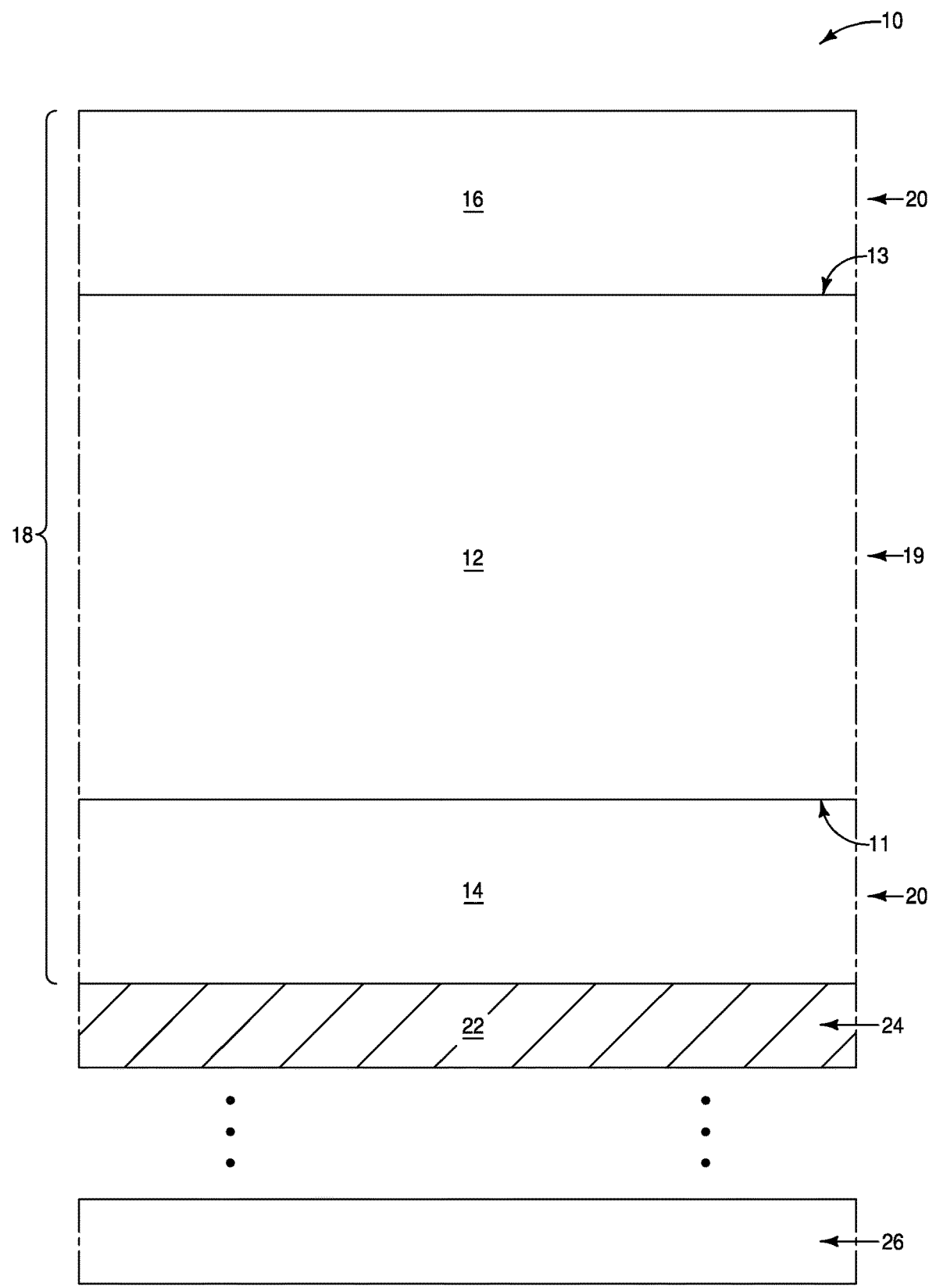

Referring to FIG. 1, a region of an integrated assembly (construction) 10 is shown at an example process stage of an example method of forming an example structure (e.g., an example transistor, and in some embodiments an example memory cell). The assembly 10 includes a first semiconductor material 12, a second semiconductor material 14, and a third semiconductor material 16. In some embodiments, the first semiconductor material may be considered to have a first side 11 and an opposing second side 13; and the second semiconductor material 14 may be considered to be directly against the first side 11 while the third semiconductor material 16 is directly against the second side 13.

The second and third semiconductor materials 14 and 16 are compositionally different from the semiconductor material 12; and may be the same composition as one another or different in composition relative to one another.

In some embodiments, the materials 12, 14 and 16 may be considered to form a stack 18 of semiconductor material. The semiconductor materials 14 and 16 may be compositionally the same as one another, and may both be referred to as "second semiconductor material". Accordingly, the stack 18 may be considered to comprise the first semiconductor material 12 as a first region 19; and such first region may be considered to be between two regions 20 of second semiconductor material (with the materials 14 and 16 both being referred to as the "second semiconductor material").

The semiconductor materials 12, 14 and 16 may comprise any suitable composition(s); and in some embodiments may comprise, consist essentially of, or consist of at least one metal (e.g., one or more of aluminum, gallium, indium, thallium, tin, cadmium, zinc, etc.,) in combination with one or more of oxygen, sulfur, selenium and tellurium.

In some embodiments, the semiconductor materials 12, 14 and 16 may each comprise at least one element from Group 13 of the periodic table (e.g., gallium) in combination with at least one element from Group 16 of the periodic table (e.g., oxygen). For instance, the semiconductor materials 12, 14 and 16 may each comprise at least one element selected from the group consisting of gallium, indium and mixtures thereof, in combination with at least one element selected from the group consisting of oxygen, sulfur, selenium, tellurium and mixtures thereof.

In some embodiments, the first semiconductor material 12 may comprise, consist essentially of, or consist of GaO (where the chemical formula indicates primary constituents rather than a specific stoichiometry); and the second and third semiconductor materials 14 and 16 may both comprise, consist essentially of, or consist of InGaZnO (where the chemical formula indicates primary constituents rather than a specific stoichiometry). The first, second and third semiconductor materials 12, 14 and 16 may thus comprise semiconductor oxides. The stoichiometric content of the semiconductor oxides may be expressed as a metal atomic percent. Specifically, the content of each of the metals of the semiconductor oxides may be expressed in terms of its concentration relative to the total concentration of all of the metals of the semiconductor oxides; and ignoring the concentration of the oxygen.

In some example embodiments, the semiconductor oxide of materials 14 and 16 may comprise InGaZnO having a metal atomic percent of indium within a range of from about 16 to about 26, a metal atomic percent of gallium within a range of from about 45 to about 55, and a metal atomic percent of zinc within a range of from about 24 to about 34. In some example embodiments, the metal atomic percent of indium may be within a range of from about 18 to about 24, the metal atomic percent of gallium may be within a range of from about 47 to about 53, and the metal atomic percent of zinc may be within a range of from about 26 to about 32.

In some example embodiments, the semiconductor oxide of material 12 may comprise GaO. Accordingly, the metal atomic percent of gallium will be about 100%.

In embodiments in which the semiconductor oxide of material 12 comprises GaO, and in which the semiconductor oxides of materials 14 and 16 comprise InGaZnO, the metal atomic percent of gallium in the first semiconductor material 12 will be greater than the metal atomic percent of gallium in the second and third semiconductor materials 14 and 16.

In the shown embodiment, the stack 18 is supported by a conductive material 22. Such conductive material may be configured as a digit line 24. The conductive material 22 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In the shown embodiment, the semiconductor material 14 is directly against an upper surface of the conductive material 22 (i.e., in some embodiments may be considered to be directly against an upper surface of the digit line 24).

The stack 18 and conductive material 22 are supported by a base 26. The base 26 may comprise semiconductor material; and may, for example, comprise, consist essentially of, or consist of monocrystalline silicon. The base 26 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 26 may correspond to a semiconductor substrate containing one or more materials associated with integrated circuit fabrication. Such materials may include, for example, one or more of refractory metal materials, barrier materials, diffusion materials, insulator materials, etc.

In the illustrated embodiment, a gap is provided between the base 26 and the conductive material 22 to indicate that there may be other materials, components, etc., provided between the base 26 and the conductive material 22.

Figure 2:
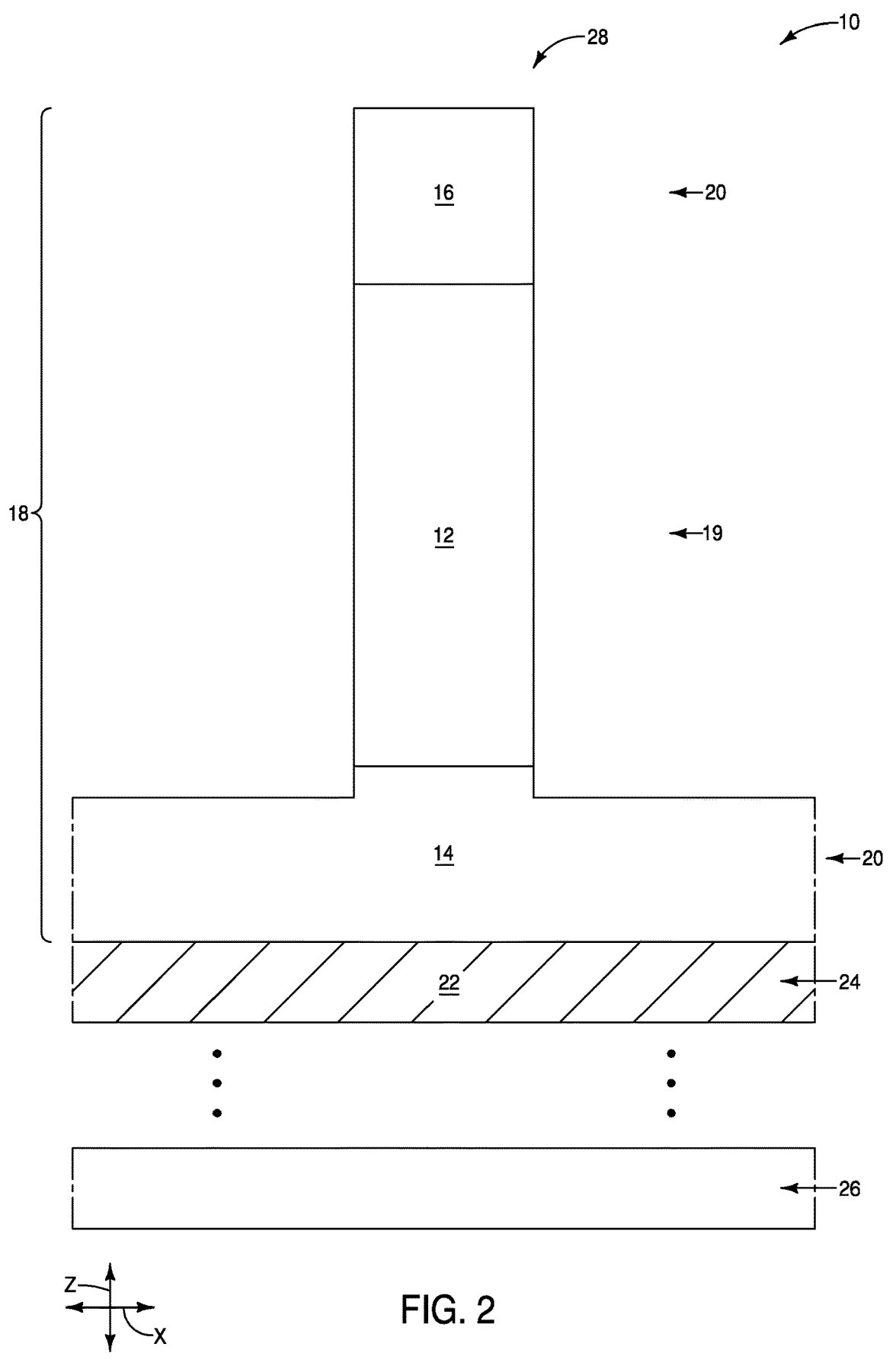

Referring to FIG. 2, the semiconductor materials 12, 14 and 16 are patterned to form a vertically-extending pillar 28. In some embodiments, the base 26 may be considered to extend along a direction of an x-axis, and the pillar 28 may be considered to extend along a direction of a z-axis; with the x-axis and z-axis being shown adjacent the construction 10 of FIG. 2, and being orthogonal to one another.

The materials 12, 14 and 16 may be patterned with any suitable methodology. For instance, a patterned mask (not shown) may be provided to define the location of the pillar 28, one or more suitable etches may be utilized to transfer the pattern into the materials 12, 14 and 16, and then the mask may be removed to leave the illustrated construction of FIG. 2.

In the shown embodiment, the pillar 28 includes a portion of the bottom semiconductor material 14. In other embodiments, the pillar may only include the semiconductor materials 12 and 16. In such other embodiments, the pillar 28 may be considered to extend upwardly from an upper surface of the bottom semiconductor material 14.

Figure 3:
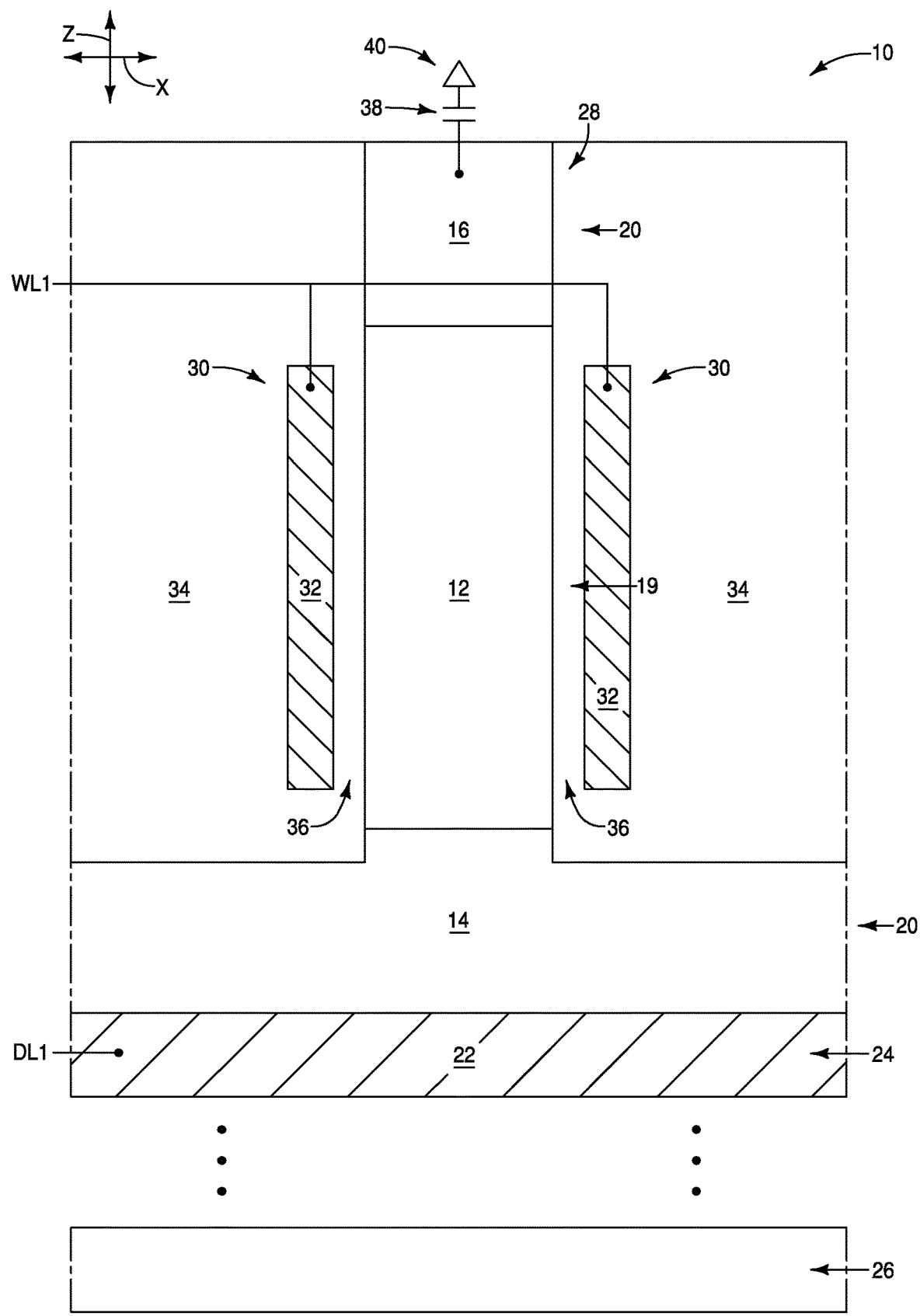

Referring to FIG. 3, a transistor gate 30 is formed adjacent the first semiconductor region 19 (i.e., adjacent the first semiconductor material 12). In the illustrated embodiment, the transistor gate vertically overlaps a portion of the first semiconductor material 12, and does not vertically overlap either of the semiconductor materials 14 and 16. In other embodiments, the gate may vertically overlap regions of one or both of the semiconductor materials 14 and 16, as discussed below with reference to FIGS. 9 and 10.

Referring still to FIG. 3, the transistor gate 30 comprises conductive material 32. The conductive material 32 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The transistor gate 30 is coupled with a wordline WL1; and in the shown embodiment is part of the wordline. The wordline extends in and out of the page relative to the cross-sectional view of FIG. 3.

Insulative material 34 extends along sidewalls of the pillar 28, and around the transistor gate 30. The insulative material 34 may comprise any suitable composition(s); and in some embodiments may comprise one or more of silicon dioxide and various high-k materials (with the term high-k meaning a dielectric constant greater than that of silicon dioxide). Regions of the insulative material 34 between the gate 30 and the pillar 28 correspond to gate dielectric material 36 (also referred to as gate insulative material). Such regions may comprise the same composition as the remaining portions of insulative material 34, or may comprise a different composition relative to the remaining portions of insulative material 34. In some embodiments, the gate dielectric material 36 may comprise, consist essentially of, or consist of silicon oxide.

The top semiconductor material 16 is electrically coupled with a storage element 38. The storage-element may be any suitable device having at least two detectable states; and in some embodiments may be, for example, a capacitor, a resistive-memory device, a conductive-bridging device, a phase-change-memory (PCM) device, a programmable metallization cell (PMC), etc.

In the illustrated embodiment, the storage element 38 is a capacitor. The capacitor 38 has a node coupled with a reference voltage 40. Such reference voltage may be ground, Vcc/2, or any other suitable reference voltage.

Figure 4:
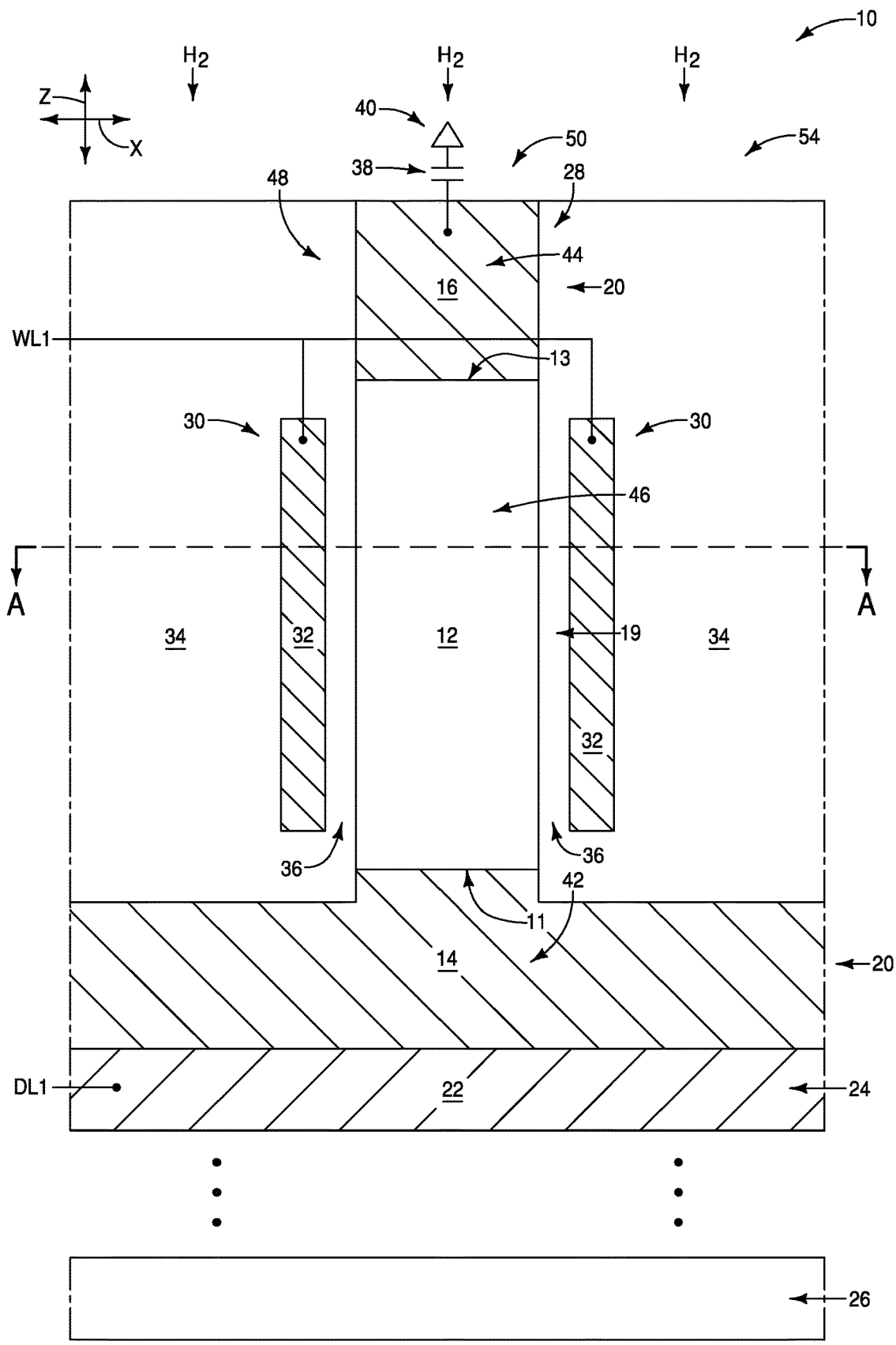

Referring to FIG. 4, hydrogen (specifically, diatomic hydrogen ($H_2$)) is diffused into the assembly 10. The hydrogen diffuses into the first and second semiconductor regions 19 and 20; and specifically diffuses into the semiconductor materials 12, 14 and 16. The conductivity of the materials 14 and 16 increases in response to the hydrogen diffused therein to convert the second semiconductor regions 20 into source/drain regions 42 and 44. The conductivity of the first semiconductor material 12 changes little, if any, in response to having the hydrogen diffused therein. Accordingly, the first semiconductor region 19 having the hydrogen diffused therein becomes a channel region 46 which extends between the source/drain regions 42 and 44.

In some embodiments, the second and third semiconductor materials 14 and 16 may be considered to have substantially increased conductivity as compared to the first semiconductor material 12 in response to the hydrogen being diffused within the materials 12, 14 and 16. For instance, the first, second and third semiconductor material 12, 14 and 16 may have about the same conductivity as one another at the processing stage of FIG. 3; and the hydrogen diffusion described with reference to FIG. 4 may increase the conductivity within the semiconductor materials 14 and 16 to form a structure in which the second regions 20 (i.e., the source/drain regions 42 and 44 of FIG. 4) have conductivity at least about 10-times greater than the conductivity of the first region 19 (i.e., the channel region 46 of FIG. 4), at least about 100-times greater than the conductivity of the first region 19, at least about 1000-times greater than the conductivity of the first region 19, etc.

In some embodiments, the conductivity of the semiconductor material 12 does not change upon diffusion of the hydrogen therein. In some embodiments, the conductivity may change, but increases much less than the conductivity increase of the materials 14 and 16 in response to the hydrogen incorporation. For instance, in some embodiments the conductivity of the first semiconductor region 19 (i.e., the semiconductor material 12) may change by an amount within a range of from about zero to about a factor of three relative to the initial conductivity of the region 19 prior to the incorporation of hydrogen therein; and the conductivity of the second semiconductor regions 20 (i.e., the semiconductor materials 14 and 16) changes by a magnitude at least about a factor of five relative to the conductivity of the regions 20 prior to the incorporation of the hydrogen therein. In some embodiments, the conductivity of the regions 20 may increase by at least about one order of magnitude, at least about two orders of magnitude, at least about three orders of magnitude, etc.

The hydrogen diffusion may utilize any suitable processing conditions. In some example embodiments, the hydrogen diffusion may correspond to a hydrogen anneal utilizing a temperature of at least about 100° C. and a pressure of at least about 1 atmosphere, for a duration of at least about one minute. The hydrogen may be provided an ambient comprising at least about 1% $H_2$, by volume, within inert carrier gas (e.g., Ar, $N_2$, etc.).

In the illustrated embodiment of FIGS. 1-4, the hydrogen diffusion occurs after formation of the transistor gate 30 and the storage element 38. In other embodiments, the hydrogen diffusion may be conducted at other process stages. For instance, the hydrogen diffusion may occur at either of the process stages of FIGS. 1 and 2. However, it may be advantageous to conduct the hydrogen diffusion late in a fabrication process in that the hydrogen diffusion may be utilized for treating other components besides the semiconductor materials 12, 14 and 16. For instance, the hydrogen diffusion may be utilized for passivating silicon/silicon dioxide interfaces as described in more detail below with reference to FIGS. 7 and 8.

The configuration of FIG. 4 includes a transistor 48 comprising the transistor gate 30 in combination with the channel region 46 and the source/drain regions 42/44. The transistor gate 30 is adjacent the channel region 46, and is configured to induce an electric field within the channel region in response to voltage being provided along the wordline WL1. The transistor 48 will have an ON-state when the electric field is induced within the channel region 46, and the source/drain regions 42 and 44 will be coupled with one another through the channel region in such ON-state. The transistor will also have an OFF-state in which the electric field is not induced in the channel region 46 to a suitable level which couples the source/drain regions 42 and 44 with one another. The channel region 46 has a lower conductivity than the source/drain regions 42 and 44 in the OFF-state of the transistor 48. In some embodiments, the conductivity of the source/drain regions 42 and 44 may be at least about 10-times greater than the conductivity of the channel region 46 in the OFF-state, at least about 100-times greater than the conductivity of the channel region in the OFF-state, at least about 1000 times greater than the conductivity of the channel region in the OFF-state, etc.

Figure 4A:
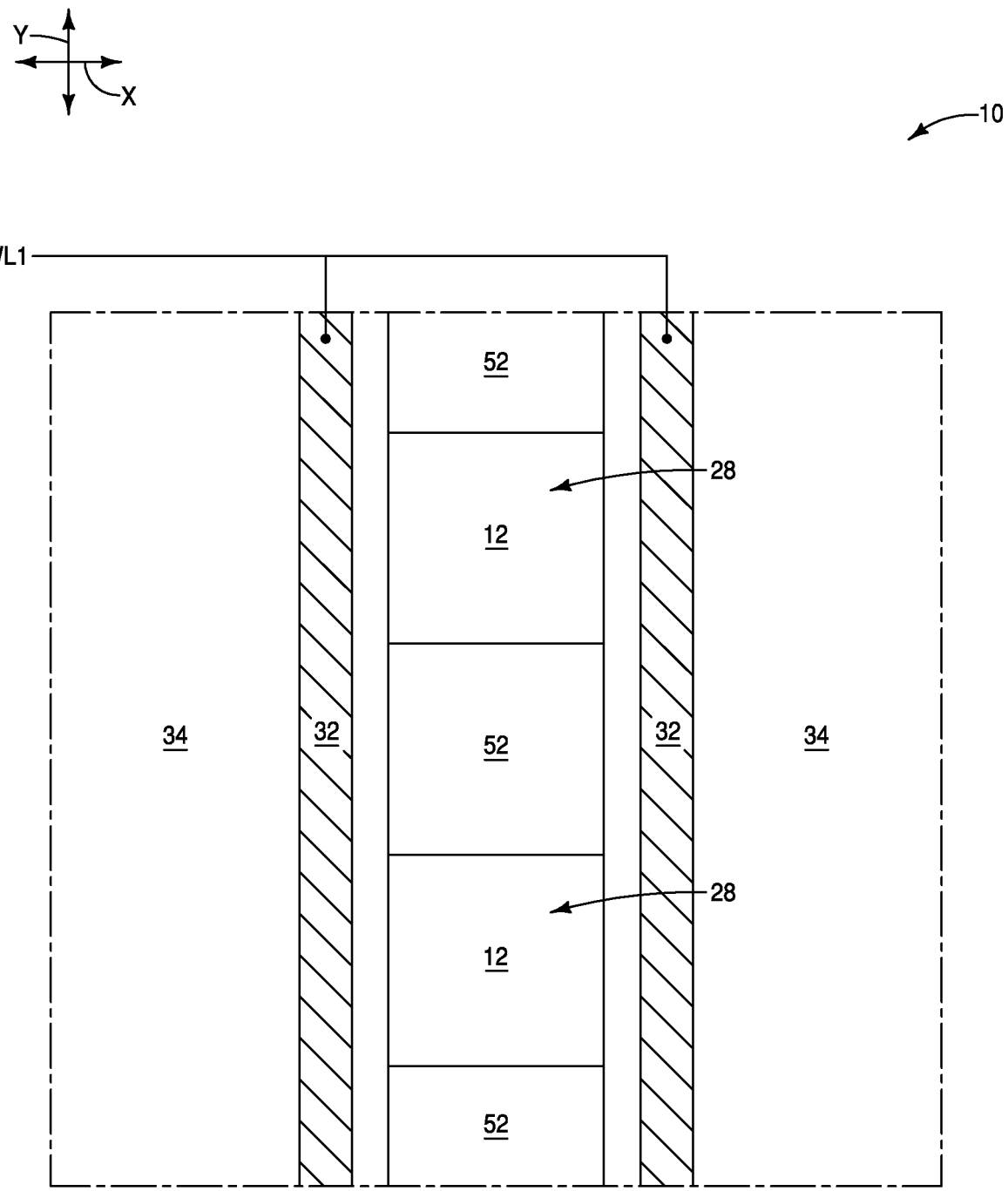
FIG. 4A is a diagrammatic cross-sectional view along the line A-A of FIG. 4.

FIG. 4A shows a view along the line A-A of FIG. 4, and shows the wordline WL1 extending along a y-axis direction, with such direction be orthogonal to the x-axis direction of the digit line DL1 (shown in FIG. 4). Also, the pillar 28 is shown to be one of several substantially identical pillars within the construction 10 (with the term "substantially identical" meaning identical to within reasonable tolerances of fabrication and measurement). The pillars 28 are spaced from one another by insulative material 52. The insulative material 52 may comprise any suitable composition(s); and in some embodiments may comprise, consist essentially of, or consist of one or both of silicon dioxide and silicon nitride.

In the illustrated embodiment, the wordline WL1 extends along two sides of each of the pillars 28. In other embodiments, the wordline may extend along only one of the sides of the pillars. In yet other embodiments, at least some of the insulative material 52 may be omitted so that the transistor gates wrap around the pillars 28.

In the illustrated embodiment of FIG. 4, the source/drain region 42 is electrically coupled with the digit line 24 (and specifically is shown to be directly against the digit line 24), and the source/drain region 44 is electrically coupled with the storage element 38.

The transistor 48 and the storage element 38 together form a memory cell 50. In some embodiments, the transistor 48 may be considered to be an access transistor utilized within the memory cell 50. The memory cell 50 may be a representative memory cell within a memory array 54, and may be one of a large number of substantially identical memory cells.

Figure 5:
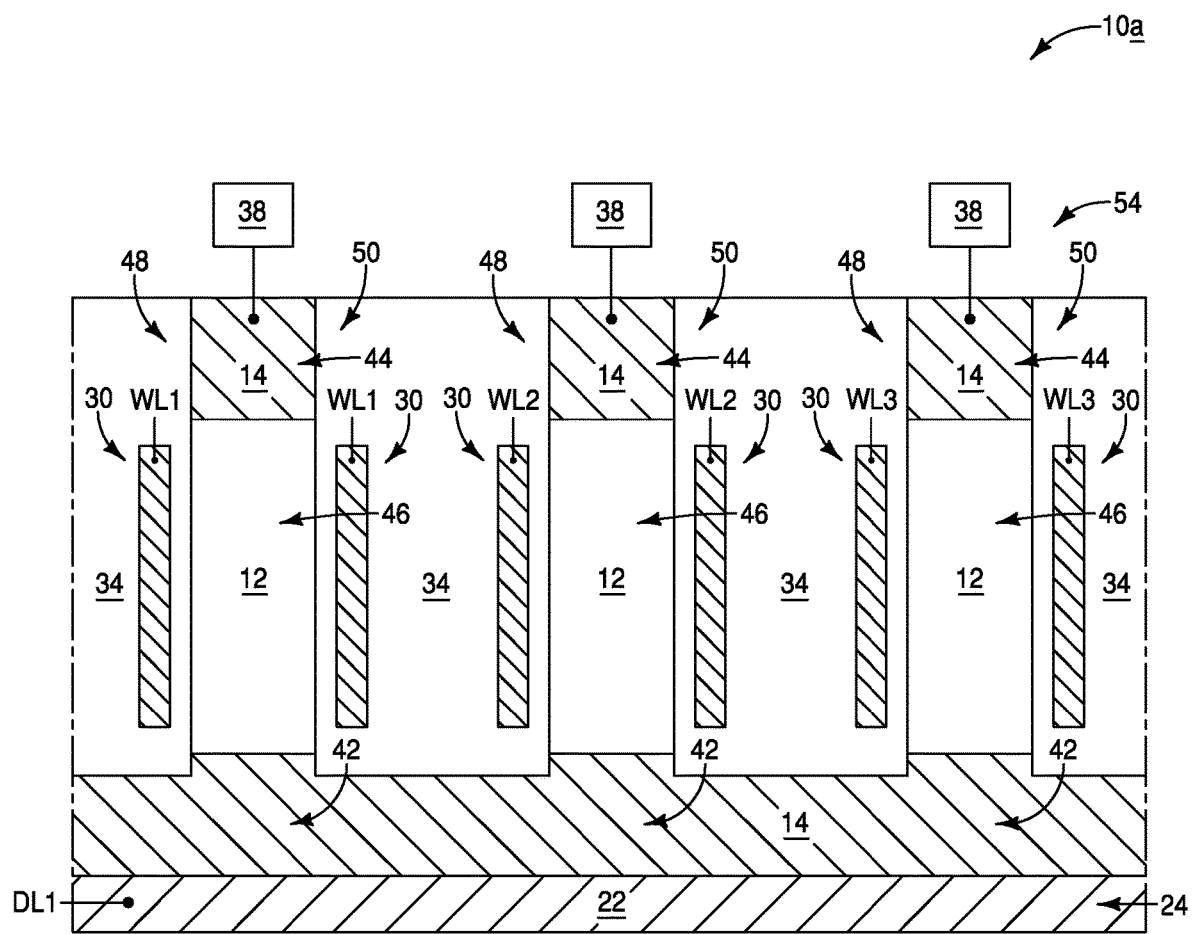
FIG. 5 is a diagrammatic cross-sectional side view of a region of an example integrated assembly comprising a portion of an example memory array.

FIG. 5 shows a portion of an integrated assembly 10a comprising a region of the example memory array 54. The memory array 54 includes several of the memory cells 50. Each memory cell includes an access transistor 48 coupled with a storage element 38. The storage elements 38 are diagrammatically illustrated with boxes to indicate that such elements may include any suitable components. The components may be capacitors of the type shown in FIG. 4, or may be other suitable devices having two or more detectable states. Each of the memory cells 50 includes a gate 30, with the gates being coupled to wordlines WL1, WL2 and WL3.

Figure 6:
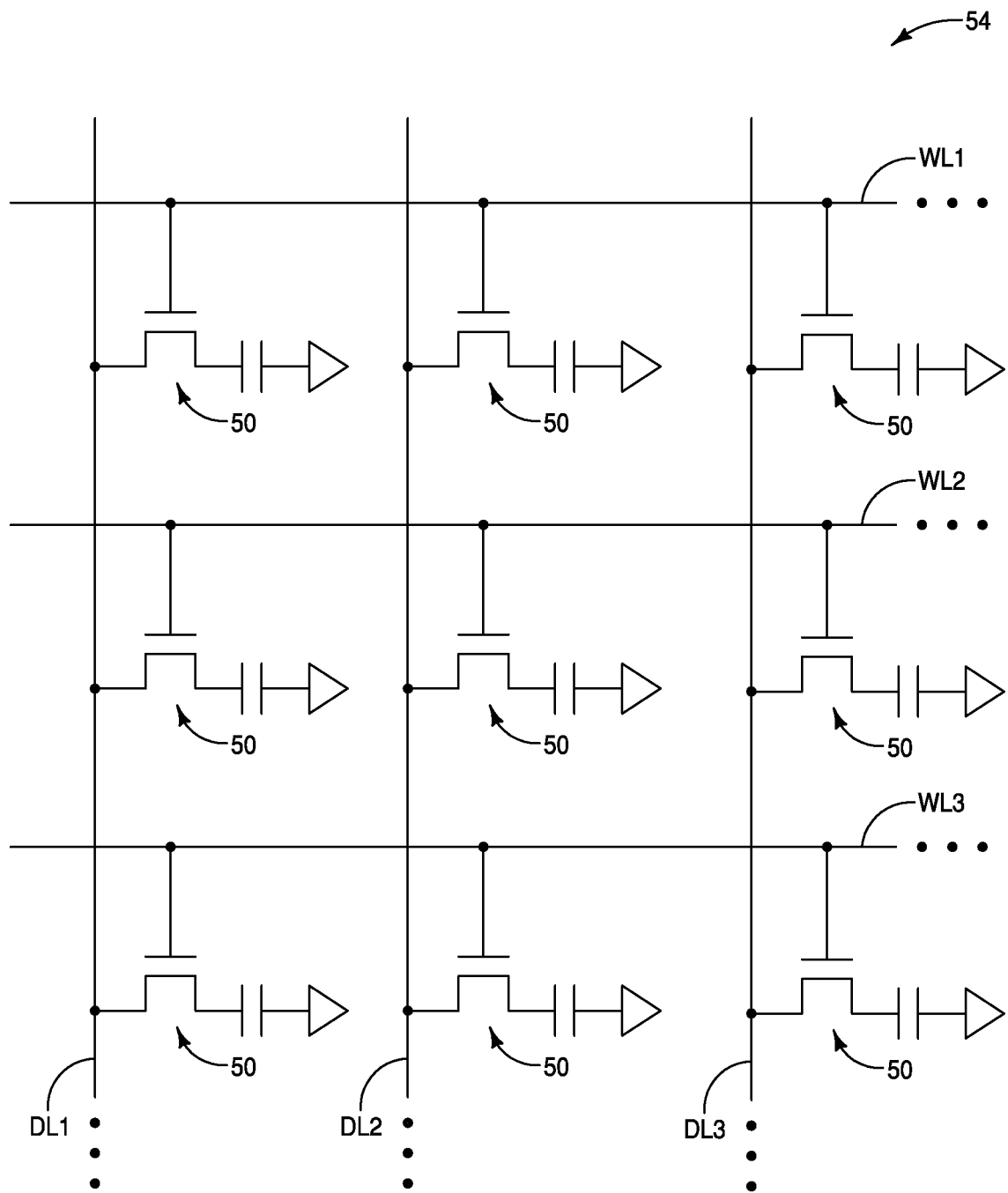
FIG. 6 is a diagrammatic schematic illustration of a region of an example memory array.

FIG. 6 schematically illustrates a portion of the memory array 54, and shows such memory array comprising digit lines DL1, DL2 and DL3, together with the wordlines WL1, WL2 and WL3. Each of the memory cells 50 within the memory array is uniquely addressed through a combination of one of the wordlines and one of the digit lines. The memory array may include any suitable number of memory cells 50; and in some embodiments may comprise hundreds, millions, tens of millions, etc., of memory cells.

Figure 7:
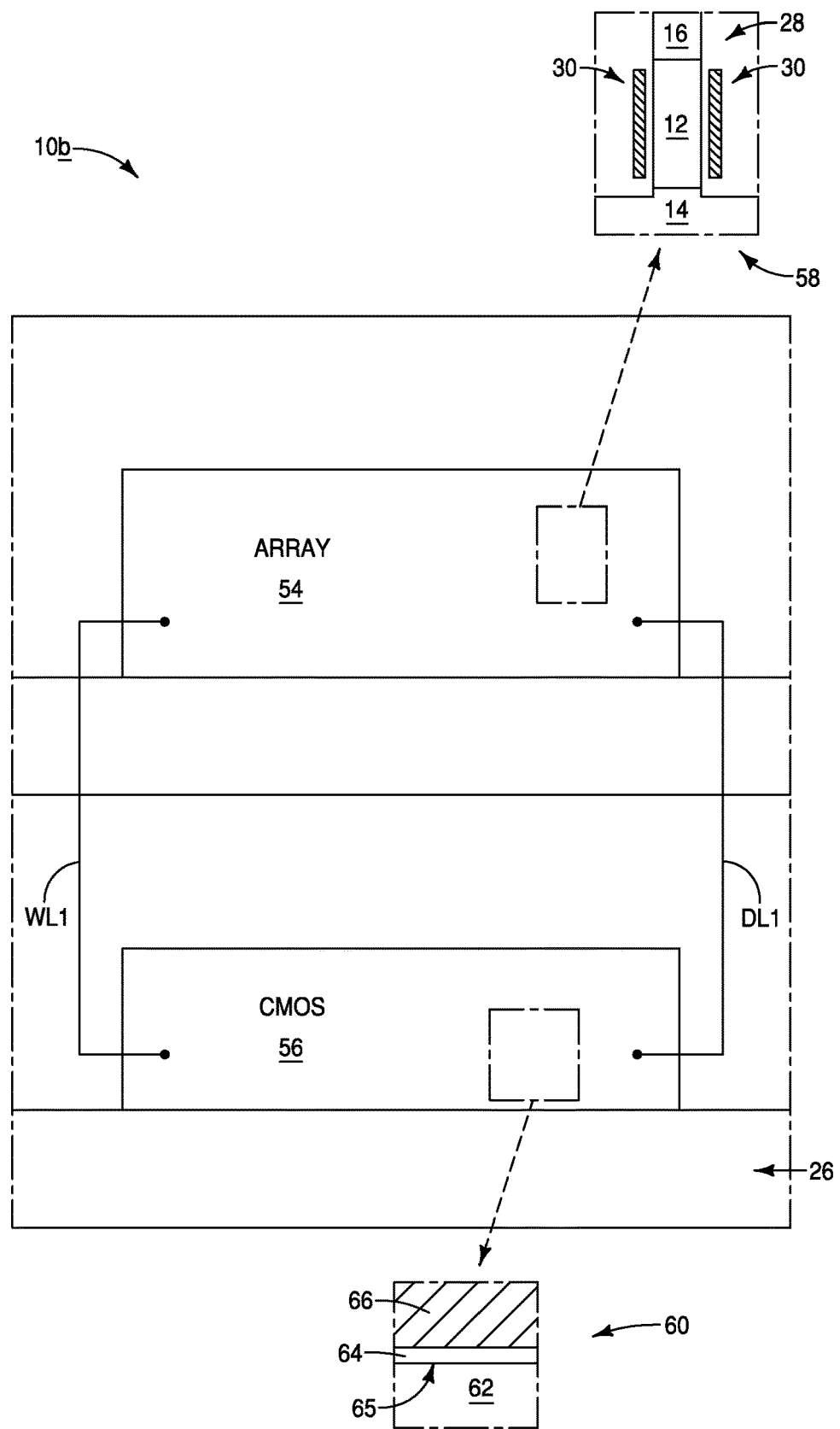
FIGS. 7 and 8 are diagrammatic side views of a region of an example integrated assembly at example process stages of an example method for treating multiple components with hydrogen.
Figure 8:
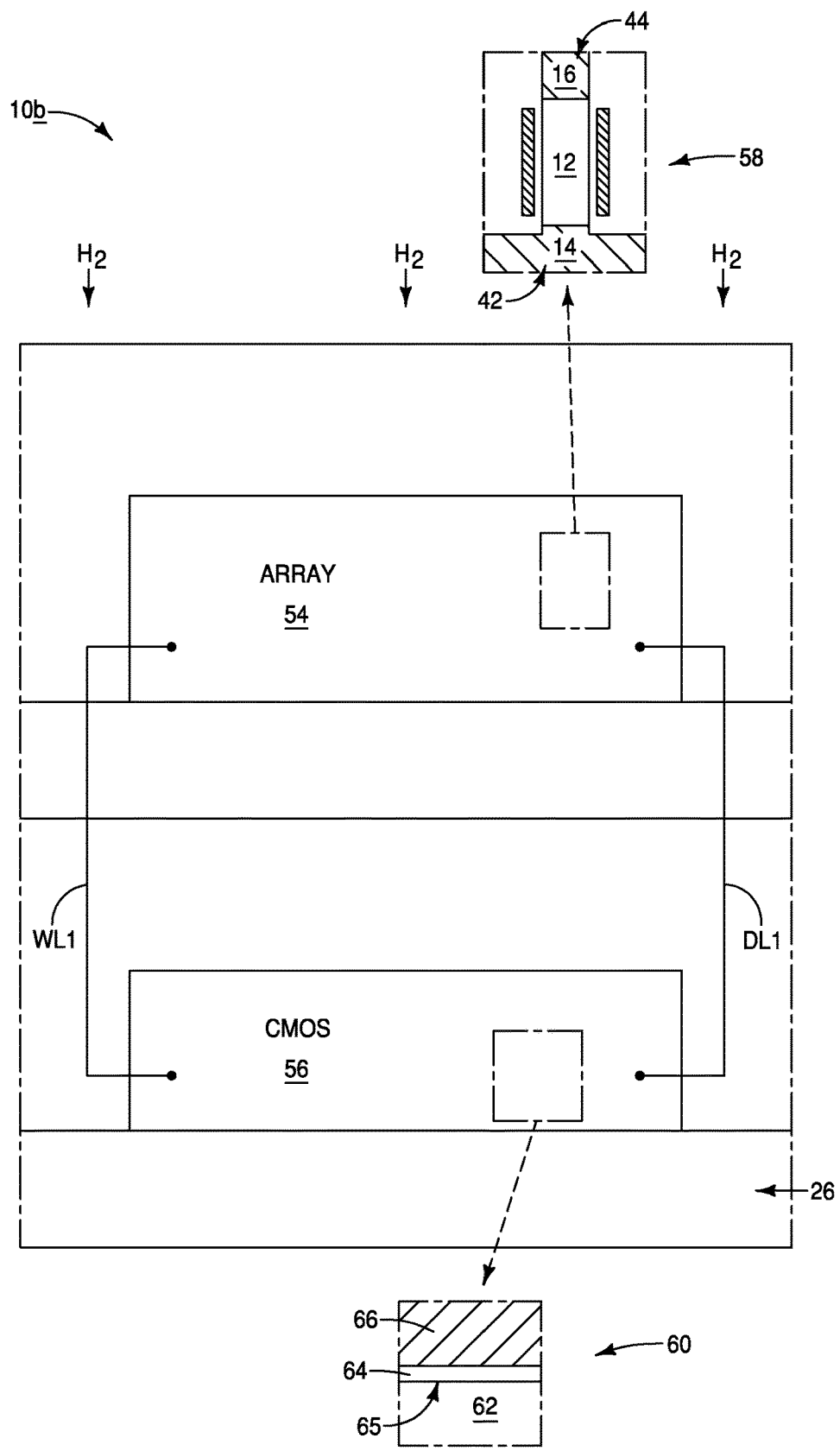

As mentioned above, in some embodiments the hydrogen diffusion (i.e., hydrogen anneal) may be utilized to increase conductivity within the semiconductor regions 20 (shown in FIGS. 3 and 4), and may also be utilized to treat other materials of an integrated assembly. For instance, FIGS. 7 and 8 show a region of a construction (integrated assembly) 10b, and illustrate an example embodiment in which the hydrogen anneal is utilized to treat silicon/silicon dioxide interfaces within CMOS (complementary metal oxide semiconductor) circuitry 56 provided proximate the memory array 54. In the illustrated embodiment, the CMOS circuitry 56 is provided under the array 54, and the digit lines (e.g., DL1) and the wordlines (e.g., WL1) extend from the array 54 to circuitry associated with the CMOS 56. In some embodiments, the wordlines may extend to wordline driver circuitry associated with the CMOS circuitry 56, and the digit lines may extend to sense amplifier circuitry associated with the CMOS circuitry 56.

FIG. 7 shows a region 58 of the array 54 in an expanded view to indicate that such region includes a pillar 28 comprising the semiconductor materials 12, 14 and 16. A region 60 of the CMOS 56 is also shown in expanded view to indicate that such region includes silicon 62 adjacent silicon dioxide 64. The illustrated region also includes conductive material 66. In some embodiments, the materials 62, 64 and 66 may be part of a planar field effect transistor (FET). The silicon 62 joins to the silicon dioxide 64 along an interface 65. Such interface may problematically comprise dangling bonds.

Referring to FIG. 8, the hydrogen anneal described above with reference to FIG. 4 may be conducted to form the source/drain regions 42 and 44 within the memory array 54. The same hydrogen anneal may also advantageously passivate the interface 65 to reduce, or even eliminate, the problematic dangling bonds.

Figure 9:
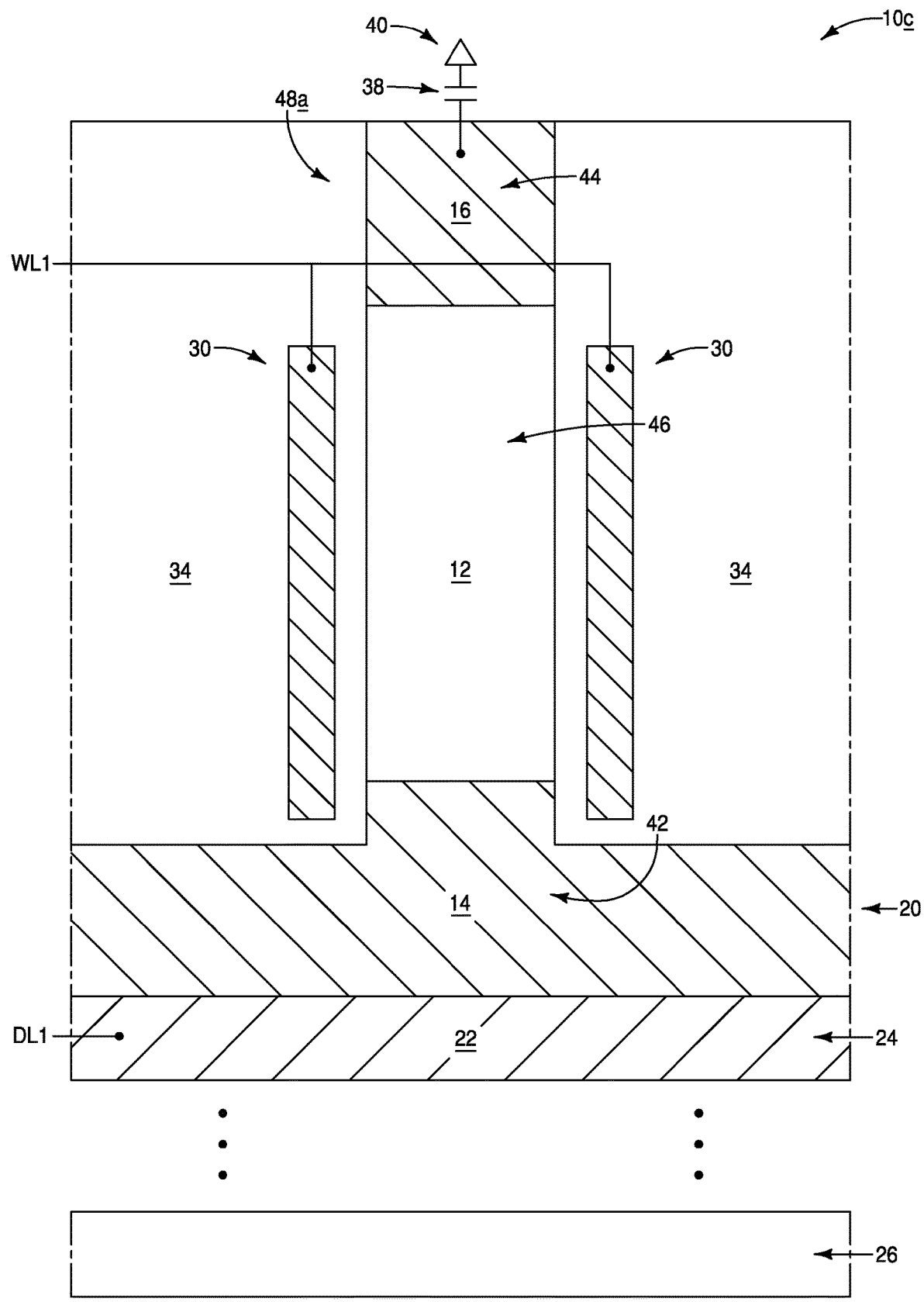
FIGS. 9 and 10 are diagrammatic cross-sectional side views of regions of example integrated assemblies illustrating example memory cells.
Figure 10:
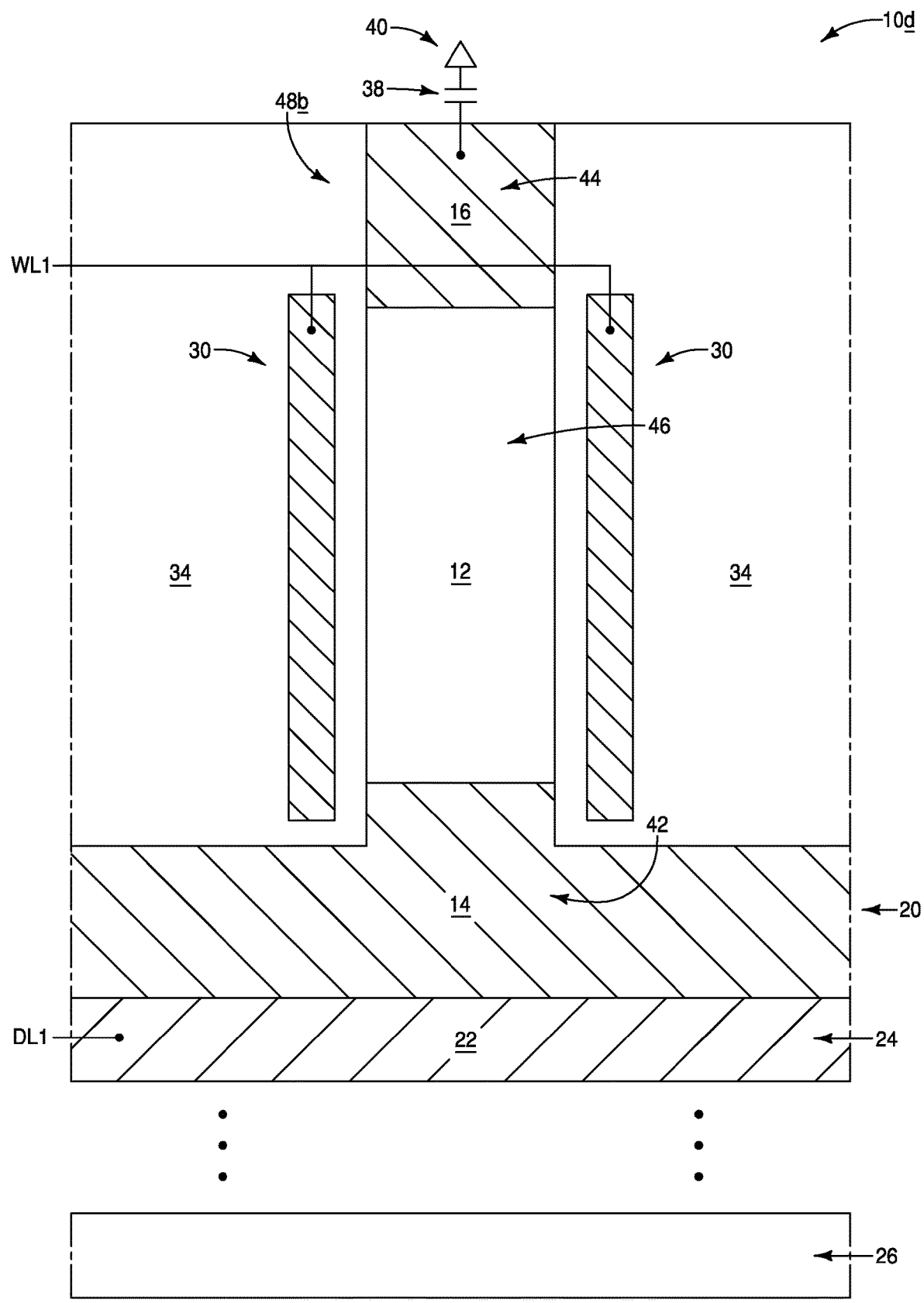

FIG. 4 shows an example transistor 48 having a conductive gate 30 which vertically overlaps the channel region 46 and not the source/drain regions 42 and 44. In other embodiments, the gate 30 may be configured to vertically overlap at least one of the source/drain regions 42 and 44. For instance, FIG. 9 shows an assembly 10*c* having a transistor 48*a* with transistor gates 30 which vertically overlap a portion of the lower source/drain region 42. As another example, FIG. 10 shows an assembly 10*d* having a transistor 48*b* with transistor gates 30 which vertically overlap portions of both the lower source/drain region 42 and the upper source/drain region 44.

Figure 11:
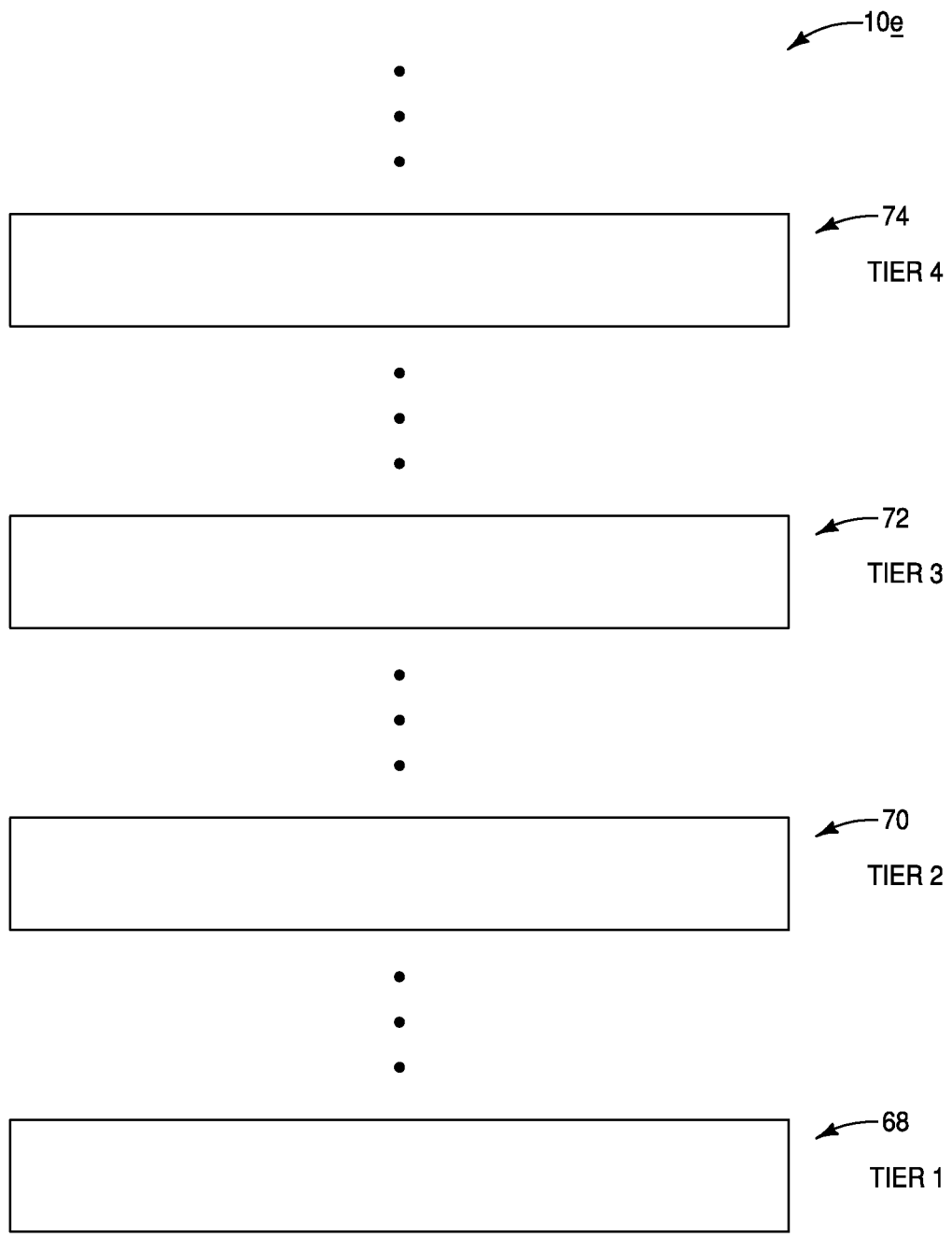
FIG. 11 is a diagrammatic cross-sectional side view of a region of an example assembly comprising stacked tiers.

In some embodiments, the memory array 54 of FIGS. 4-6 may be within a memory tier (i.e., memory deck) which is within a vertically-stacked arrangement of tiers (or decks). For instance, FIG. 11 shows a portion of an integrated assembly 10*e* comprising a vertically-stacked arrangement of tiers 68, 70, 72 and 74 (also labeled as tiers 1-4). The vertically-stacked arrangement may extend upwardly to include additional tiers. The tiers 1-4 may be considered to be examples of levels that are stacked one atop the other. The levels may be within different semiconductor dies (wafers), or at least two of the levels may be within the same semiconductor die. The bottom tier (tier 1) may include control circuitry and/or sensing circuitry (e.g., may include wordline drivers, sense amplifiers, etc.; and may include the CMOS circuitry of FIGS. 7 and 8). The upper tiers (tiers 2-4) may include memory arrays, such as, for example, the memory array 54. The memory arrays within the various tiers may be the same as one another (e.g., may all be DRAM arrays), or may be different relative to one another (e.g., some may be DRAM arrays, while others are NAND arrays). Also, one or more of the upper tiers may include control circuitry or other logic circuitry.

Figure 12:
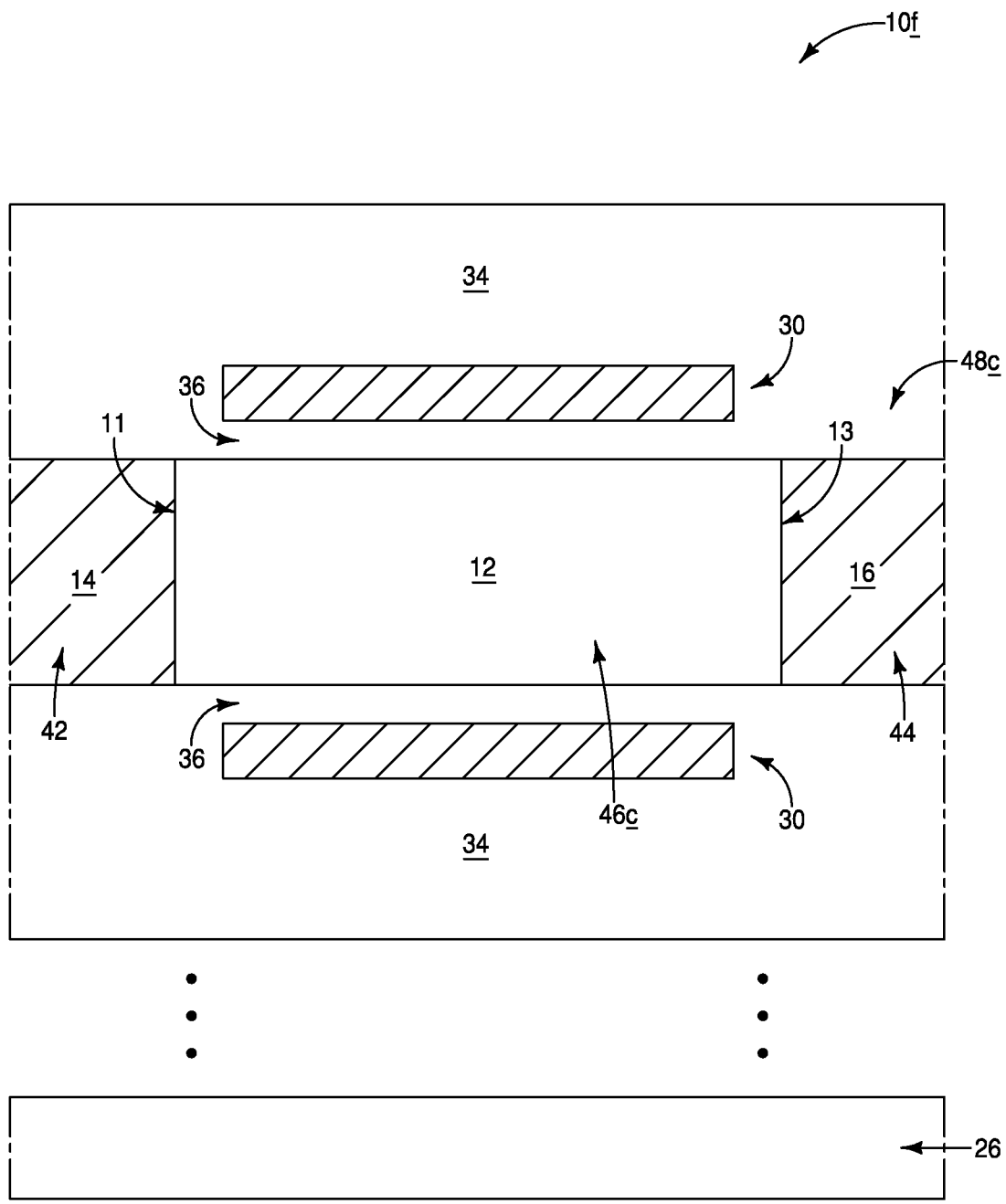
FIG. 12 is a diagrammatic cross-sectional side view of a region of an example integrated assembly comprising an example transistor.
Figure 12:
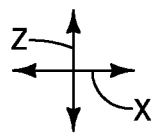

The embodiment of FIG. 4 shows a transistor 48 having a vertically-extending channel region. In other embodiments, analogous transistors may be configured to have horizontally-extending channel regions. For instance, FIG. 12 shows a portion of an integrated assembly 10*f* having a transistor 48*c* with a horizontally-extending channel region 46*c* (i.e., the channel region 46*c* extends along the direction of the x-axis). The transistor 48*c* is supported by the base 26, and is similar to the transistor 48 of FIG. 4 except that the channel region 46*c* of the transistor 48*c* extends horizontally (i.e., along the x-axis), while the channel region 46 of the transistor 48 of FIG. 4 extends vertically (i.e., along the z-axis). In some embodiments, the semiconductor material 12 of the transistor 48*c* of FIG. 12 may be considered to have the first side 11 and the second side 13 in a horizontally-disposed relation relative to one another. In contrast, the same first and second sides 11 and 13 of the transistor 46 of FIG. 4 are in a vertically-disposed relation relative to one another.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly which includes a first semiconductor material having a first side and an opposing second side. A second semiconductor material is directly adjacent to the first side of the first semiconductor material and is of a different composition than the first semiconductor material. A third semiconductor material is directly adjacent to the second side of the first semiconductor material and is of a different composition than the first semiconductor material. Hydrogen is diffused within the first, second and third semiconductor materials. The second and third semiconductor materials have substantially increased conductivity as compared to the first semiconductor material in response to the hydrogen diffused therein.

Some embodiments include an integrated assembly having a first semiconductor material between two regions of a second semiconductor material. The second semiconductor material is a different composition than the first semiconductor material. Hydrogen is diffused within the first semiconductor material and the second semiconductor material. The conductivity of the second semiconductor material increases in response to the hydrogen diffused therein to thereby create a structure having the second semiconductor material as source/drain regions, and having the first semiconductor material as a channel region between the source/drain regions. A transistor gate is adjacent the channel region and is configured to induce an electric field within the channel region.

Some embodiments include a method of forming an integrated assembly. A construction is formed which includes a first semiconductor region between a pair of second semiconductor regions. The first semiconductor region comprises a different composition relative to the second semiconductor regions. A transistor gate is formed adjacent the first semiconductor region. Hydrogen is diffused within the first and second semiconductor regions. The conductivity of the second semiconductor regions increases in response to the hydrogen diffused therein to convert the second semiconductor regions to source/drain regions. The first semiconductor region having the hydrogen diffused therein is a channel region between the source/drain regions. The source/drain regions, the channel region and the transistor gate are together comprised by a transistor. The transistor gate is configured to induce an electric field in the channel region in an ON-state of the transistor and thereby couple the source/drain regions with one another through the channel region in the ON-state. The transistor has an OFF-state. The channel region has a lower conductivity than the source/drain regions in the OFF-state of the transistor.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
a first semiconductor material having a first side and an opposing second side;
a second semiconductor material directly adjacent to the first side of the first semiconductor material and being of a different composition than the first semiconductor material;
a third semiconductor material directly adjacent to the second side of the first semiconductor material and being of a different composition than the first semiconductor material, the first, second and a portion of the third semiconductor materials comprising a vertically-extending pillar; and
only one gate adjacent one side of the vertically-extending pillar; and
hydrogen diffused within the first, second and third semiconductor materials; the second and third semiconductor materials having substantially increased conductivity as compared to the first semiconductor material in response to the hydrogen diffused therein.

2. The integrated assembly of claim 1 wherein the substantially increased conductivity of the second and third semiconductor materials having the hydrogen therein is at least about 10-times greater than the conductivity of the first semiconductor material having the hydrogen therein.

3. The integrated assembly of claim 1 wherein the substantially increased conductivity of the second and third semiconductor materials having the hydrogen therein is at least about 100-times greater than the conductivity of the first semiconductor material having the hydrogen therein.

4. The integrated assembly of claim 1 wherein the substantially increased conductivity of the second and third semiconductor materials having the hydrogen therein is at least about 1000-times greater than the conductivity of the first semiconductor material having the hydrogen therein.

5. The integrated assembly of claim 1 wherein the second and third semiconductor materials are same composition as one another.

6. The integrated assembly of claim 1 wherein the second and third semiconductor materials are different compositions relative to one another.

7. The integrated assembly of claim 1 wherein the first, second and third semiconductor materials each comprises at least one metal in combination with one or more of oxygen, sulfur, selenium and tellurium.

8. The integrated assembly of claim 7 wherein the at least one metal is one or more of aluminum, gallium, indium, thallium, tin, cadmium and zinc.

9. The integrated assembly of claim 1 wherein the first, second and third semiconductor materials each comprises at least one element from Group 13 of the periodic table in combination with at least one element from Group 16 of the periodic table.

10. The integrated assembly of claim 1 wherein the first, second and third semiconductor materials each comprises at least one element selected from the group consisting of gallium, indium and mixtures thereof, in combination with at least one element selected from the group consisting of oxygen, sulfur, selenium, tellurium and mixtures thereof.

11. The integrated assembly of claim 1 wherein the first semiconductor material comprises GaO, and wherein the second and third semiconductor materials each comprises InGaZnO; where the chemical formulas indicate primary constituents rather than a specific stoichiometry.

12. An integrated assembly, comprising:
a first semiconductor material between two regions of a second semiconductor material; the second semiconductor material being a different composition than the first semiconductor material;
hydrogen diffused within the first semiconductor material and the second semiconductor material; the conductivity of the second semiconductor material increasing in response to the hydrogen diffused therein to thereby create a structure having the second semiconductor material as source/drain regions, and having the first semiconductor material as a channel region between the source/drain regions; and only one vertically extending transistor gate adjacent one side of the channel region and elevationally spaced from the two regions of the second semiconductor material, the transistor gate configured to induce an electric field within the channel region.

13. The integrated assembly of claim 12 comprising a base under the first and second semiconductor materials and supporting the first and second semiconductor materials; and wherein the source/drain regions are horizontally disposed relative to one another.

14. The integrated assembly of claim 12 comprising a base under the first and second semiconductor materials and supporting the first and second semiconductor materials; and wherein the source/drain regions are vertically disposed relative to one another.

15. The integrated assembly of claim 14 wherein the transistor gate vertically overlaps at least a portion of the channel region and does not vertically overlap either of the source/drain regions.

16. The integrated assembly of claim 12 wherein:
the channel region and the source/drain regions are comprised by an access transistor;
a storage element is coupled with one of the source/drain regions and a digit line is coupled with the other of the source/drain regions;
the transistor gate is coupled with a wordline; and
the access transistor and the storage element are comprised by a memory cell.

17. The integrated assembly of claim 16 wherein the memory cell is one of many substantially identical memory cells within a memory array; wherein the wordline is one of many wordlines within the memory array; wherein the digit line is one of many digit lines within the memory array; and wherein each of the memory cells is uniquely addressed through one of the digit lines in combination with one of the wordlines.

18. The integrated assembly of claim 17 wherein the memory array is within a tier; the tier being within a vertically-stacked arrangement of tiers and being over at least one other of the tiers within the vertically-stacked arrangement.

19. The integrated assembly of claim 12 wherein the first and second semiconductor materials comprise gallium; and wherein the metal atomic percent of gallium in the first semiconductor material is greater than the metal atomic percent of gallium in the second semiconductor material.

20. The integrated assembly of claim 12 wherein the first and second semiconductor materials each comprises at least one metal in combination with one or more of oxygen, sulfur, selenium and tellurium.

21. The integrated assembly of claim 20 wherein the at least one metal is one or more of aluminum, gallium, indium, thallium, tin, cadmium and zinc.

22. The integrated assembly of claim 12 wherein the first semiconductor material comprises GaO, and wherein the second semiconductor material comprises InGaZnO; where the chemical formulas indicate primary constituents rather than a specific stoichiometry.

23. The integrated assembly of claim 1 wherein the first, second and third semiconductor materials each comprises at least one metal comprising thallium.

24. The integrated assembly of claim 1 further comprising a conductive line against and along the length of one of the second and third semiconductor materials.

25. The integrated assembly of claim 1 further comprising a digit line against and along the length of one of the second and third semiconductor materials.

26. The integrated assembly of claim 1 wherein the vertically-extending pillars comprise a square configuration in the horizontal cross section.

27. The integrated assembly of claim 12 further comprising:
a gate dielectric between the transistor gate and the channel region; and
an insulative material adjacent a side of the transistor gate opposite the gate dielectric, the gate dielectric and the insulative material comprising the same composition.

28. The integrated assembly of claim 12 further comprising:
a gate dielectric between the transistor gate and the channel region; and
an insulative material adjacent a side of the transistor gate opposite the gate dielectric, the gate dielectric and the insulative material comprising different compositions.

29. The integrated assembly of claim 12 wherein the first and second semiconductor materials each comprises at least one metal comprising thallium.

30. The integrated assembly of claim 12 further comprising a conductive line against and along the length of one of the two regions of the second semiconductor material.

31. The integrated assembly of claim 30 wherein the conductive line comprises a digit line.

32. The integrated assembly of claim 1 wherein the gate extends vertically.

33. The integrated assembly of claim 1 wherein the gate comprises a lowermost surface and the portion of the third semiconductor material comprises an uppermost surface, the lowermost surface of the gate is elevationally above the uppermost surface of the portion of the third semiconductor material.

34. The integrated assembly of claim 12 wherein the first and second semiconductor materials comprise a vertically-extending pillar, only a portion of at least one of the two regions of the second semiconductor material comprises the vertically-extending pillar.

35. The integrated assembly of claim 12 further comprising a digit line against and along the length of the bottommost one of the two regions of the second semiconductor material.

* * * * *